United States Patent
Tseng

(10) Patent No.: US 6,355,538 B1
(45) Date of Patent: Mar. 12, 2002

(54) METHOD OF FORMING ISOLATION MATERIAL WITH EDGE EXTENSION STRUCTURE

(75) Inventor: Horng-Huei Tseng, Hsin-Chu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/664,416

(22) Filed: Sep. 18, 2000

(51) Int. Cl.⁷ .............................................. H01L 21/76
(52) U.S. Cl. ...................... 438/424; 257/510
(58) Field of Search .................. 438/421, 424, 438/426; 257/510

(56) References Cited

U.S. PATENT DOCUMENTS

| 5,578,518 A | * 11/1996 | Koike et al. | 438/424 |
| 5,712,185 A | * 1/1998 | Tsai et al. | 438/424 |
| 5,880,004 A | * 3/1999 | Ho | 438/421 |
| 5,940,716 A | 8/1999 | Jin et al. | 438/424 |
| 6,090,684 A | * 7/2000 | Itshitsuka et al. | 438/424 |
| 6,103,635 A | * 8/2000 | Chau et al. | 438/739 |
| 6,242,323 B1 | * 6/2001 | Ishitsuka et al. | 438/435 |

FOREIGN PATENT DOCUMENTS

| EP | 0 098 374 A2 | * 1/1984 | H01L/21/76 |
| EP | 000603106 A2 | * 6/1994 | H01L/21/76 |
| JP | 176604 | * 5/1993 | H01L/21/76 |

* cited by examiner

Primary Examiner—Charles Bowers
Assistant Examiner—David S Blum
(74) Attorney, Agent, or Firm—George O. Saile; Stephen B. Ackerman; Larry J. Prescott

(57) ABSTRACT

A method of forming an isolation trench structure wherein the dielectric material filling the trench extends beyond the trench edges thereby preventing gaps at the trench edges. A layer of first dielectric is formed on a silicon substrate and a layer of silicon, either polysilicon or amorphous silicon, or silicon nitride is formed on the layer of first dielectric. A resist mask having a trench opening is then formed on the layer of silicon or silicon nitride. An isotropic lateral etch, either a plasma isotropic lateral etch or a chemical wet etch, is then used to etch that part of said silicon or silicon nitride directly under the trench opening in the resist mask and to undercut the silicon or silicon nitride a first distance beyond the edge of the trench opening in the resist mask, thereby forming an oversize trench opening in the layer of silicon or silicon nitride. The trench opening is then transferred to the layer of first dielectric and a trench is formed in the silicon substrate. The resist mask is then removed and a layer of second dielectric is deposited. That part of the layer of second dielectric above the top surface of the layer of silicon or silicon nitride, the layer of silicon or silicon nitride, and the layer of first dielectric are then removed to complete the structure.

23 Claims, 5 Drawing Sheets

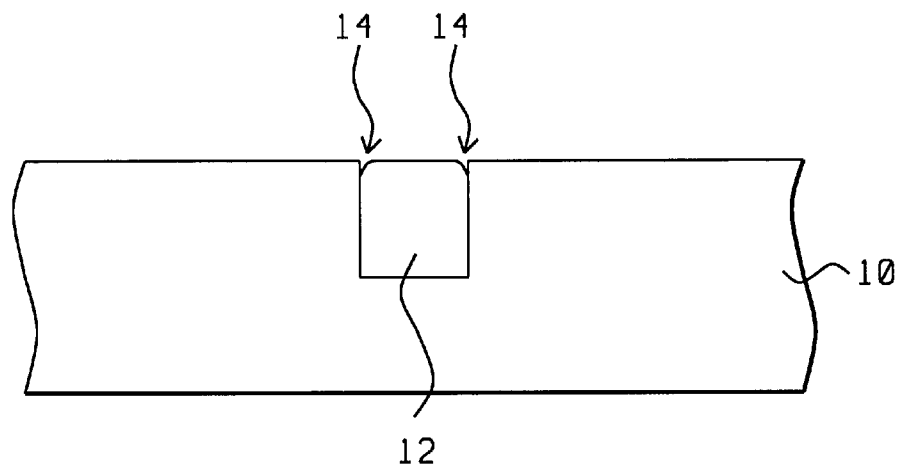
*FIG. 1 - Prior Art*
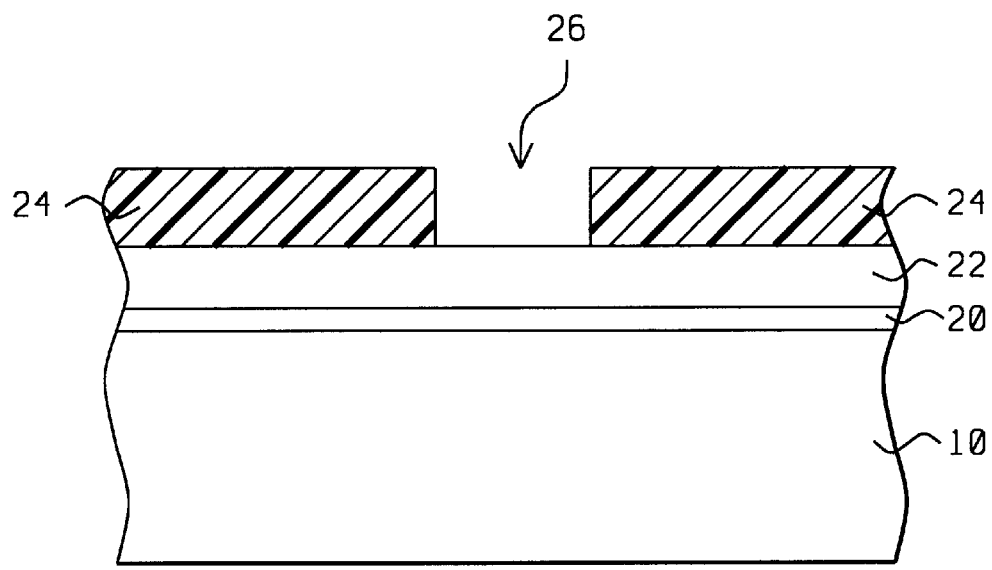
*FIG. 2*

METHOD OF FORMING ISOLATION MATERIAL WITH EDGE EXTENSION STRUCTURE

BACKGROUND OF THE INVENTION

1. Field of the Invention

This invention relates to methods of forming shallow trench isolation structures in integrated circuit chips and more specifically to forming isolation trenches wherein the material filling the trenches extends beyond the trench edges.

2. Description of the Related Art

Device isolation techniques are important in the design and operation of integrated circuit chips where spacing between devices is very small. LOCOS or local oxidation of silicon has been frequently used to accomplish this device isolation however there are problems with the use of LOCOS in structures with small device separation such as the well known birds beak formation at the edge of the isolation region.

Shallow trench isolation has been used frequently in designs having reduced separation between devices but there are also problems with the use of shallow trench isolation, such as that illustrated in FIG. 1. FIG. 1 shows a cross section of a portion of an integrated circuit chip 10 using shallow trench isolation. FIG. 1 shows a trench in an integrated circuit chip 10 filled with a dielectric material 12. A problem can be encountered in the formation and filling of the trenches wherein the dielectric filling the trenches can be etched away at the edge of the trench forming gaps 14, as shown in FIG. 1. These gaps 14 will be a problem in future processing steps.

Patent application Ser. No. 09/655,082, filed on Sep. 5, 2000 entitled "METHOD OF FORMING ISOLATION MATERIAL WITH SMOOTH PROFILE", and assigned to the same Assignee describes methods of forming trench isolation structures wherein the dielectric filling the trenches has a smooth profile without gaps.

U.S. Pat. No. 5,940,716 to Jin et al. describes a method of forming isolation trenches which overcomes the problems of the gaps 14 shown in FIG. 1. Jin et al. describe a method wherein the dielectric used to fill the trench overlaps the top edge of the trench to avoid the gaps. In the method described by Jin et al. a trench is formed in a structure comprising a substrate having a first dielectric formed thereon and a second dielectric formed on the first dielectric. The structure is then etched with an etchant which preferably etches the second dielectric relative to the first dielectric and substrate to enlarge the opening in the second dielectric.

SUMMARY OF THE INVENTION

It is a principal objective of this invention to provide a method of forming trench isolation structures wherein the isolation trench is filled with dielectric which extends beyond the edges of the trench, and thereby avoids the formation of gaps.

This objective is achieved by forming a layer of first dielectric on a silicon substrate and a layer of silicon or silicon nitride on the layer of first dielectric. The silicon can be either polysilicon or amorphous silicon. A resist mask having a trench opening is then formed on the layer of silicon or silicon nitride. An isotropic lateral etch, either a plasma isotropic lateral etch or a chemical wet etch, is then used to etch that part of the silicon or silicon nitride directly under the trench opening in the resist mask and to undercut the silicon or silicon nitride a first distance beyond the edge of the trench opening in the resist mask. This forms an oversize trench opening in the layer of silicon or the layer of silicon nitride.

Vertical anisotropic etching is then used to etch away that part of the layer of first dielectric directly under the trench opening in the resist mask and a second distance into that part of the silicon substrate directly under the trench opening in the resist mask. This forms a trench opening in the layer of first dielectric and a trench in the silicon substrate. The resist mask is then removed.

The trench in the silicon substrate, the trench opening in the layer of first dielectric, and the oversize trench opening in the layer of silicon or the layer of silicon nitride are then filled with second dielectric. Any second dielectric above the top surface of the layer silicon or silicon nitride is then removed. The layer of silicon or silicon nitride is then removed. That part of the layer of first dielectric not covered by the second dielectric is then removed forming a second dielectric plug filling the trench in the silicon substrate and extending beyond the edges of the trench in the silicon substrate.

BRIEF DESCRIPTION OF THE DRAWINGS

FIG. 1 shows a cross section view of a part of a silicon substrate showing a conventional isolation trench filled with dielectric.

FIG. 2 shows a cross section view of a part of a silicon substrate having a layer of first dielectric formed thereon, a layer of silicon or silicon nitride formed on the layer of first dielectric, and a resist mask having a trench opening formed on the layer of silicon or silicon nitride.

DESCRIPTION OF THE PREFERRED EMBODIMENTS

Figure 3:
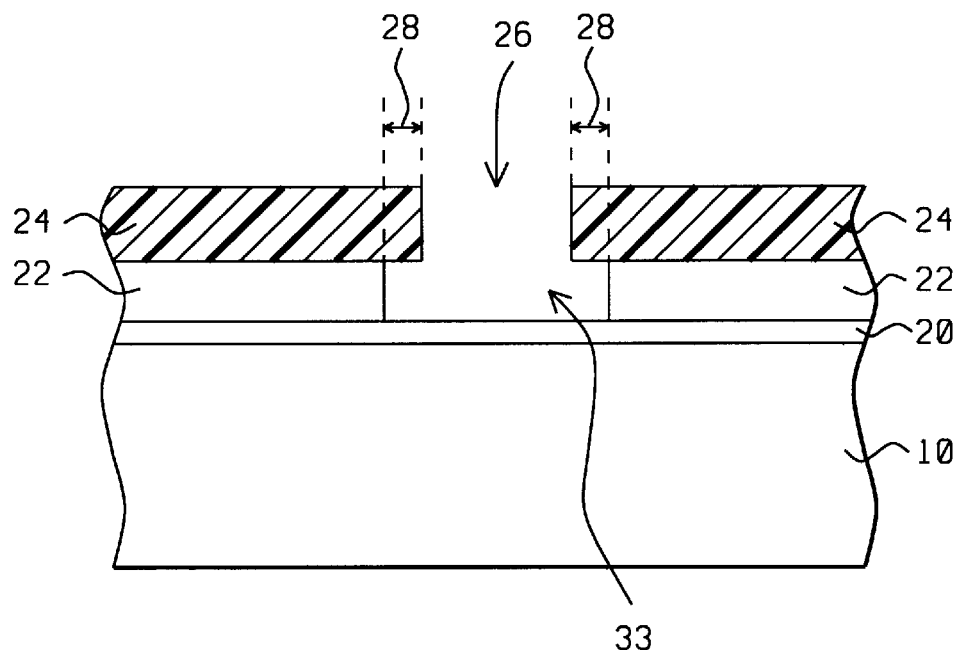
FIG. 3 shows a cross section view of the part of the silicon substrate showing the silicon or silicon nitride etched through the trench opening in the resist mask and undercut a first distance beyond the edges of the resist mask.

Refer now to FIGS. 2–10 for a description of a preferred embodiment of the method of forming a trench isolation structure of this invention. FIG. 2 shows a cross section view of a substrate 10 having a layer of first dielectric 20 formed thereon. In this embodiment a layer of silicon 22 is formed on the layer of first dielectric 20. In this example the substrate is a silicon substrate having devices formed therein and the layer of first dielectric is a layer of silicon dioxide, $SiO_2$, having a thickness of between about 50 and 500 Angstroms. In this example the layer of silicon 22 is a layer of either polysilicon or amorphous silicon having a thickness of between about 300 and 2000 Angstroms. A resist mask 24 having a trench opening 26 is formed on the layer of silicon 22.

The key step of the method of this invention is then performed, as shown in FIG. 3, wherein an isotropic lateral etch, such as either a plasma isotropic lateral etch or a chemical wet etch, is carried out to etch away that part of the layer of silicon 22 directly under the trench opening 26 in the resist mask and a first distance 28 beyond the edges of the trench opening 26 in the resist mask 24, thereby forming an oversize trench opening 33 in the layer of silicon 22. The plasma isotropic lateral etch uses a lower RF, radio frequency, power and a higher gas pressure than an anisotropic etch. In this example the plasma isotropic lateral etch uses an etchant of oxygen. This etch results in the profile shown in FIG. 3 where the first distance 28, the distance the layer of silicon 22 is etched beyond the edge of the resist mask 24, is between about 50 and 500 Angstroms.

Figure 4:
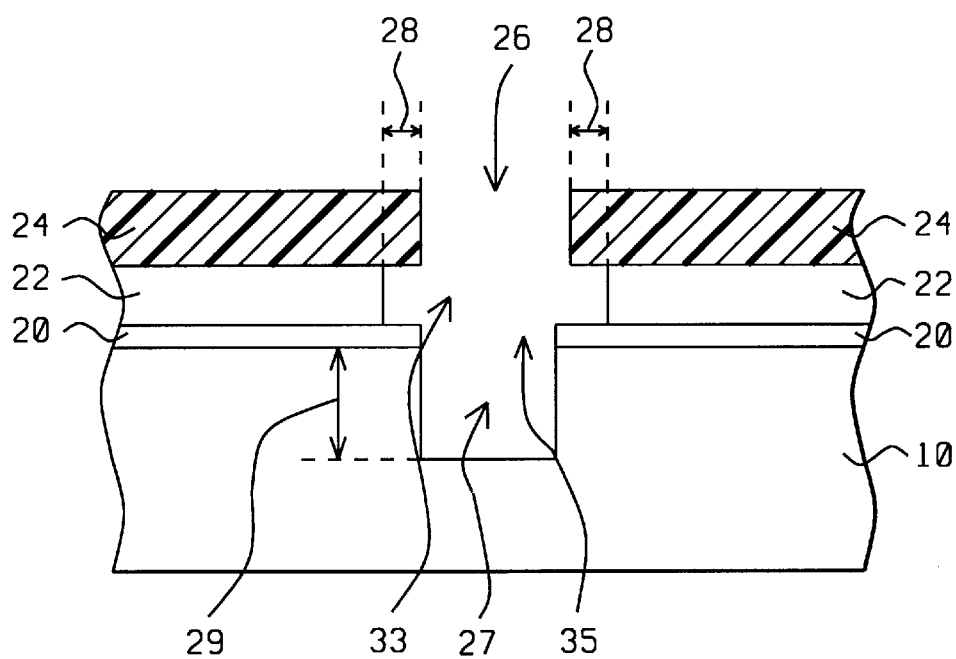
FIG. 4 shows a cross section view of the part of the silicon substrate showing the trench opening formed in the layer of first dielectric and a trench formed in the silicon substrate.
Figure 5:
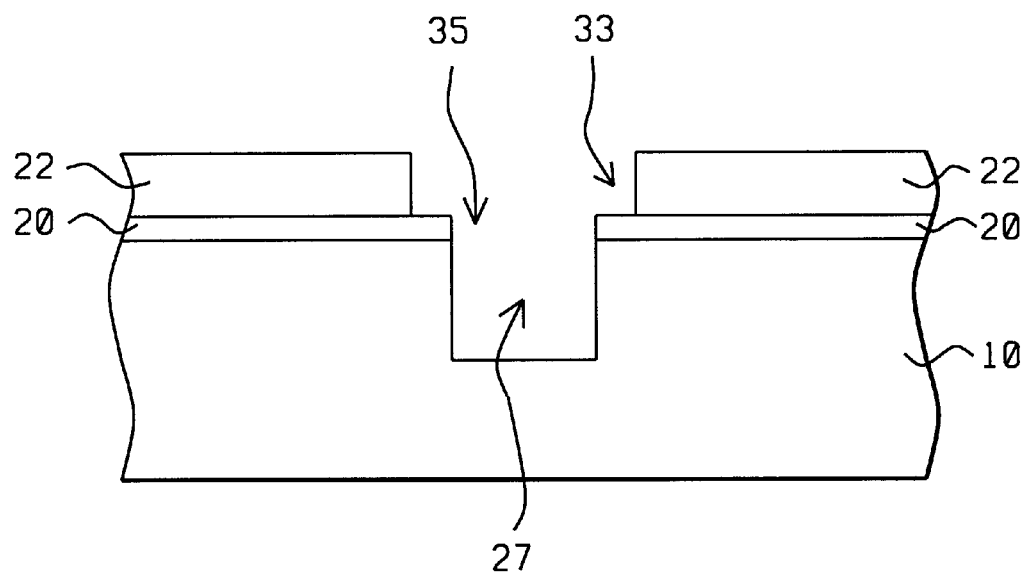
FIG. 5 shows a cross section view of the part of the silicon substrate after the resist mask has been removed.

Next, as shown in FIG. 4, vertical dry anisotropic etching is used to etch away that part of the layer of first dielectric 20 directly under the trench opening 26 in the resist mask 24, forming a trench opening 35 in the layer of first dielectric 20. The vertical dry anisotropic etching is also used to etch away a second distance 29 of that part of the substrate 10 directly under the trench opening 26 in the resist mask 24, thereby forming a trench 27 in the substrate 10. The second distance 29 is between about 1000 and 5000 Angstroms. As shown in FIG. 5, the resist mask is then removed.

Figure 6:
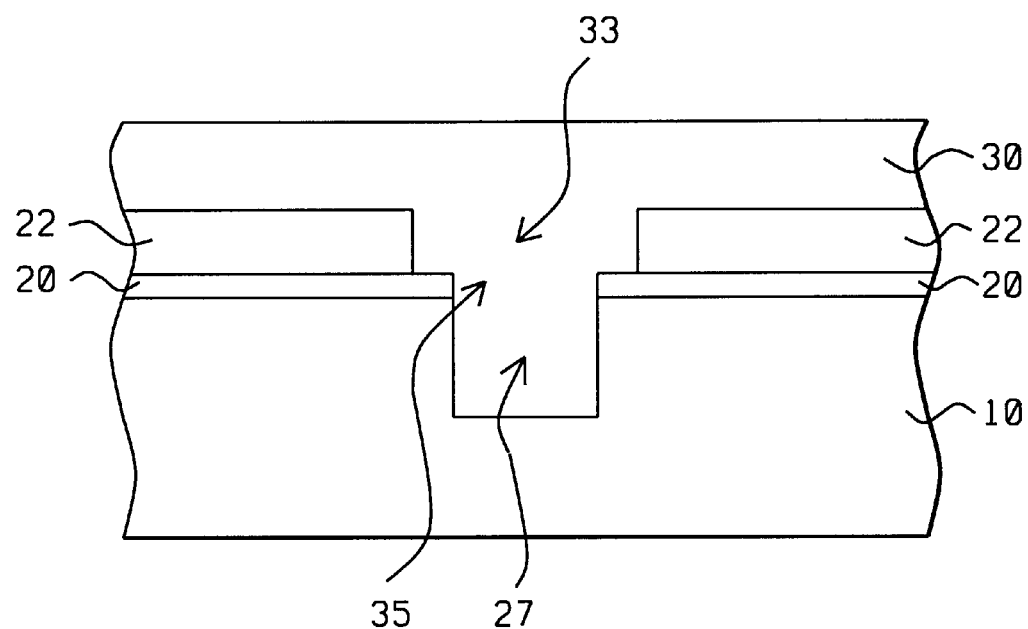
FIG. 6 shows a cross section view of the part of the silicon substrate after a layer of second dielectric has been deposited to fill the trench and the openings in the layer of first dielectric and layer of silicon or silicon nitride.
Figure 7:
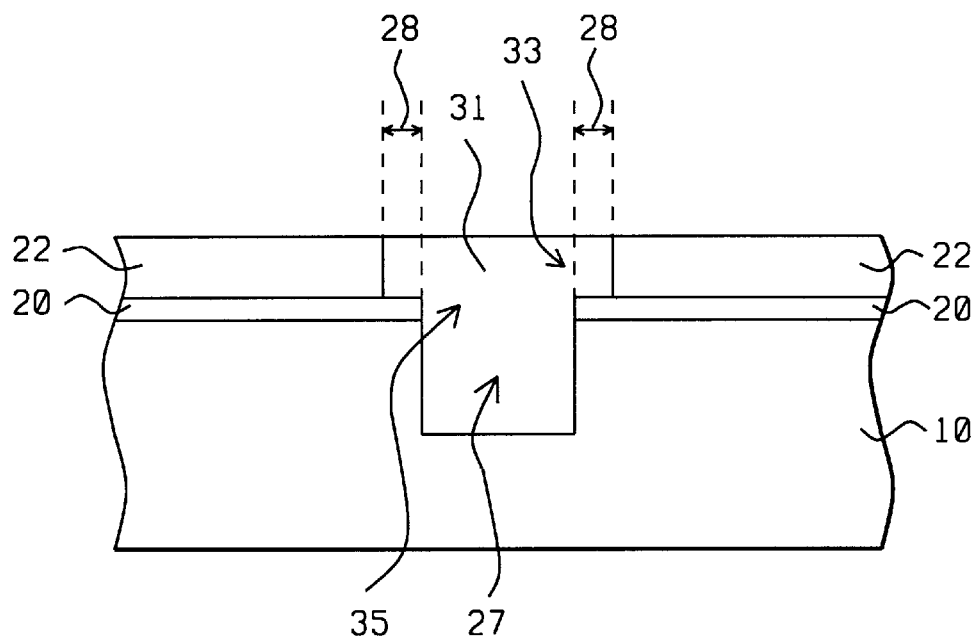
FIG. 7 shows a cross section view of the part of the silicon substrate after that part of the layer of second dielectric above the top surface of the layer of silicon or silicon nitride has been removed.

Next, as shown in FIG. 6, a layer of second dielectric 30 is deposited to completely fill the trench 27 in the silicon substrate 10, the trench opening 35 in the layer of first dielectric 20, and the oversize trench opening 33 in the layer of silicon 22. The layer of second dielectric can be a layer of silicon dioxide, $SiO_2$, having a thickness of between about 500 and 6000 Angstroms. As shown in FIG. 7, the layer of second dielectric material above the top surface of the layer of silicon 22 is removed using a method such as chemical mechanical polishing, thereby forming a second dielectric plug 31 filling the trench 27 in the silicon substrate 10, the trench opening 35 in the layer of first dielectric 20, and the oversize trench opening 33 in the layer of silicon 22. As shown in FIG. 7, the second dielectric plug 31 overlaps the edge of the trench 27 in the silicon substrate 10 and part of the layer of first dielectric 20 by the first distance 28.

Figure 8:
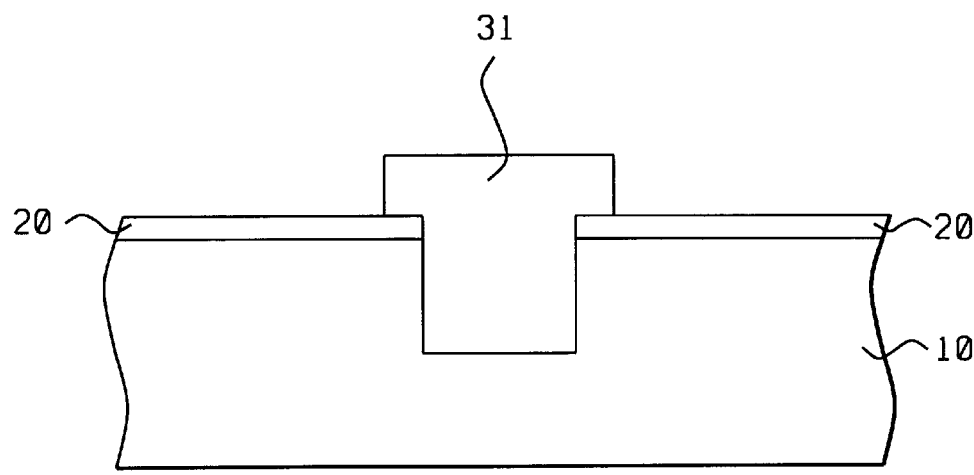
FIG. 8 shows a cross section view of the part of the silicon substrate after the layer of silicon or silicon nitride has been removed.
Figure 9:
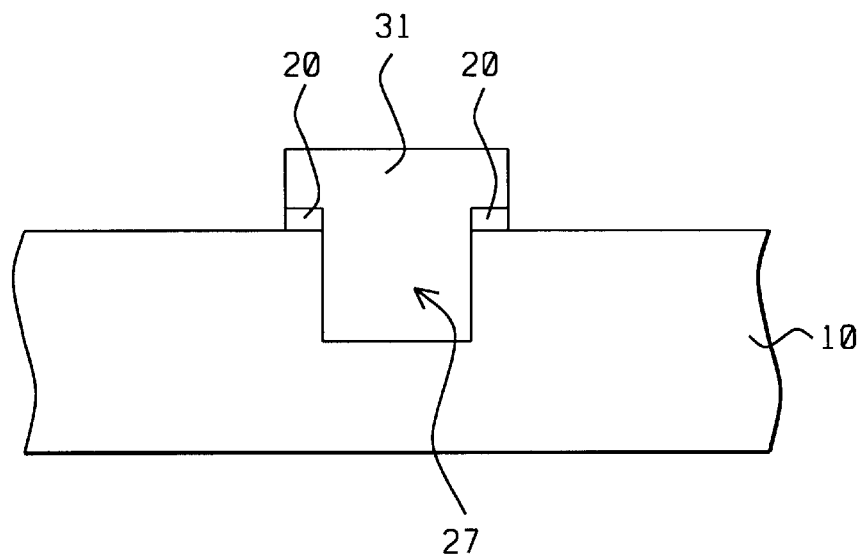
FIG. 9 shows a cross section view of the part of the silicon substrate showing the completed trench isolation structure after that part of the layer of first dielectric not covered by the second dielectric plug has been removed.
Figure 10:
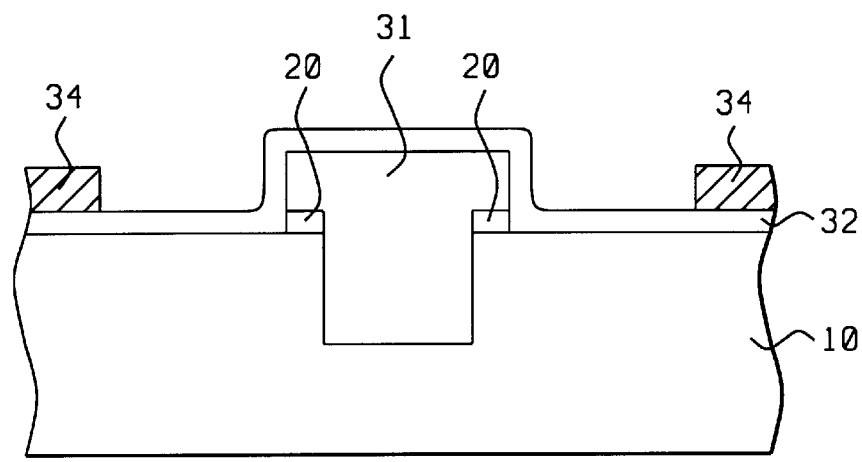
FIG. 10 shows a cross section view of the part of the silicon substrate after the trench isolation structure has been completed and a layer of gate oxide has been deposited and gate electrodes have been formed.

As shown in FIG. 8, the layer of silicon, in this example either polysilicon or amorphous silicon, is then etched away using a plasma etch. In this example this plasma etch uses an etchant of Halogen gas plasma. This etching step preferentially etches the silicon relative to the layer of first dielectric 20, $SiO_2$, and to the second dielectric plug 31, also $SiO_2$. As shown in FIG. 9, that part of the layer of first dielectric, in this example $SiO_2$, which is not covered by the second dielectric plug 31 is then etched away using a hydrofluoric acid, HF, etch to complete the trench isolation structure. This etch will also partially etch the second dielectric plug 31, but will leave second dielectric material extending beyond the edges of the trench 27 as shown in FIG. 9. As shown in FIG. 9, the second dielectric plug 31 overlaps the edges of the trench 27 and prevents the formation of voids at the trench edge. As shown in FIG. 10, a layer of gate oxide 32 and gate electrodes 43 can then be formed.

Refer again to FIGS. 2–10 for a description of another preferred embodiment of the method of forming a trench isolation structure of this invention. In this embodiment the layer of silicon will be replaced by a layer of silicon nitride. FIG. 2 shows a cross section view of a substrate 10 having a layer of first dielectric 20 formed thereon. In this embodiment a layer of silicon nitride, SiN, 22 is formed on the layer of first dielectric 20. In this example the substrate is a silicon substrate having devices formed therein and the layer of first dielectric is a layer of silicon dioxide, $SiO_2$, having a thickness of between about 50 and 500 Angstroms. In this example the layer of silicon nitride 22 has a thickness of between about 300 and 2000 Angstroms. A resist mask 24 having a trench opening 26 is formed on the layer of silicon nitride 22.

The key step of the method of this invention is then performed, as shown in FIG. 3, wherein an isotropic lateral etch, such as either a plasma isotropic lateral etch or a chemical wet etch, is carried out to etch away that part of the layer of silicon nitride 22 directly under the trench opening 26 in the resist mask and a first distance 28 beyond the edges of the trench opening 26 in the resist mask 24, thereby forming an oversize trench opening 33 in the layer of silicon nitride 22. The plasma isotropic lateral etch uses a lower RF, radio frequency, power and a higher gas pressure than an anisotropic etch. In this example the plasma isotropic lateral etch uses an etchant of oxygen. This etch results in the profile shown in FIG. 3 where the first distance 28, the distance the layer of silicon nitride 22 is etched beyond the edge of the resist mask 24, is between about 50 and 500 Angstroms.

Next, as shown in FIG. 4, vertical dry anisotropic etching is used to etch away that part of the layer of first dielectric 20 directly under the trench opening 26 in the resist mask 24, forming a trench opening 35 in the layer of first dielectric 20. The vertical dry anisotropic etching is also used to etch away a second distance 29 of that part of the substrate 10 directly under the trench opening 26 in the resist mask 24, thereby forming a trench 27 in the substrate 10. The second distance 29 is between about 1000 and 5000 Angstroms. As shown in FIG. 5, the resist mask is then removed.

Next, as shown in FIG. 6, a layer of second dielectric 30 is deposited to completely fill the trench 27 in the silicon substrate 10, the trench opening 35 in the layer of first dielectric 20, and the oversize trench opening 33 in the layer of silicon nitride 22. The layer of second dielectric can be a layer of silicon dioxide, $SiO_2$, having a thickness of between about 500 and 6000 Angstroms. As shown in FIG. 7, the layer of second dielectric material above the top surface of the layer of silicon nitride 22 is removed using a method such as chemical mechanical polishing thereby forming a second dielectric plug 31. As shown in FIG. 7, the second dielectric plug 31 overlaps the edge of the trench 27 in the silicon substrate 10 and part of the layer of first dielectric 20 by the first distance 28.

As shown in FIG. 8, the layer of silicon nitride, SiN, 22 is then etched away using a phosphoric acid etch. This etching step preferentially etches the silicon nitride relative to the layer of first dielectric 20, $SiO_2$, and the second dielectric plug 31, also $SiO_2$. As shown in FIG. 9, that part of the layer of first dielectric, in this example $SiO_2$, which is not covered by the second dielectric plug 31 is then etched away using a hydrofluoric acid, HF, etch to complete the trench isolation structure. This etch will also partially etch the second dielectric plug 31, but will leave second dielectric material extending beyond the edges of the trench 27 as shown in FIG. 9. As shown in FIG. 9, the second dielectric plug 31 overlaps the edges of the trench 27 and prevents the formation of voids at the trench edge. As shown in FIG. 10, a layer of gate oxide 32 and gate electrodes 43 can then be formed.

While the invention has been particularly shown and described with reference to the preferred embodiments thereof, it will be understood by those skilled in the art that various changes in form and details may be made without departing from the spirit and scope of the invention.

What is claimed is:

1. A method of forming a trench isolation structure, comprising:

providing a substrate having a layer of first dielectric formed thereon and a layer of silicon formed on said layer of dielectric;

forming a resist mask on said layer of silicon wherein said resist mask has a trench opening with edges;

etching away that part of said layer of silicon directly under said trench opening and a first distance beyond said edges of said trench opening in said resist mask using said resist mask and an isotropic lateral etch, thereby forming an oversize trench opening in said layer of silicon;

etching away that part of said layer of first dielectric directly under said trench opening in said resist mask and a second distance into that part of said substrate directly under said trench opening in said resist mask using said resist mask and dry vertical anisotropic etching, thereby forming a trench opening having edges in said layer of first dielectric and a trench having edges in said substrate;

removing said resist mask;

forming a layer of second dielectric on said substrate thereby filling said trench in said substrate, said trench opening in said layer of first dielectric, and said oversize trench opening in said layer of silicon with said second dielectric;

removing that part of said second dielectric above the top surface of said layer of silicon thereby forming a second dielectric plug, wherein said second dielectric plug fills said trench in said substrate, said trench opening in said layer of first dielectric, and said oversize trench opening in said layer of silicon and extends beyond said edges of said trench opening in said layer of first dielectric and said edges of said trench in said substrate;

etching away said layer of silicon using an etching method which preferentially etches said silicon relative to said first dielectric and said second dielectric; and etching away that part of said layer of first dielectric not covered by said second dielectric plug.

2. The method of claim 1 wherein said layer of silicon is a layer of polysilicon having a thickness of between about 300 and 2000 Angstroms.

3. The method of claim 1 wherein said layer of silicon is a layer of amorphous silicon having a thickness of between about 300 and 2000 Angstroms.

4. The method of claim 1 wherein said layer of first dielectric is a layer of silicon dioxide having a thickness of between about 50 and 500 Angstroms.

5. The method of claim 1 wherein said layer of second dielectric is a layer of silicon dioxide having a thickness of between about 500 and 6000 Angstroms.

6. The method of claim 1 wherein said substrate is a silicon substrate having devices formed therein.

7. The method of claim 1 wherein said isotropic lateral etch is a plasma isotropic lateral etch using an etchant of oxygen.

8. The method of claim 1 wherein said isotropic lateral etch is a chemical wet etch.

9. The method of claim 1 wherein said etching away said layer of silicon uses a plasma etch with an etchant of Halogen gas plasma.

10. The method of claim 1 wherein said etching away that part of said layer of first dielectric not covered by said second dielectric plug uses a hydrofluoric acid, HF, etch.

11. The method of claim 1 wherein said removing that part of said second dielectric above the top surface of said layer of silicon uses chemical mechanical polishing.

12. The method of claim 1 further comprising:

forming a layer of gate oxide on said substrate and said second dielectric plug; and forming gate electrodes on said layer of gate oxide.

13. A method of forming a trench isolation structure, comprising:

providing a substrate having a layer of first dielectric formed thereon and a layer of silicon nitride formed on said layer of first dielectric;

forming a resist mask on said layer of silicon nitride wherein said resist mask has a trench opening with edges;

etching away that part of said layer of silicon nitride directly under said trench opening and a first distance beyond said edges of said trench opening in said resist mask using said resist mask and an isotropic lateral etch, thereby forming an oversize trench opening in said layer of silicon nitride;

etching away that part of said layer of first dielectric directly under said trench opening in said resist mask and a second distance into that part of said substrate directly under said trench opening in said resist mask, after forming said oversize trench opening in said layer of silicon nitride, using said resist mask and dry vertical anisotropic etching, thereby forming a trench opening having edges in said layer of first dielectric and a trench having edges in said substrate;

removing said resist mask;

forming a layer of second dielectric on said substrate thereby filling said trench in said substrate, said trench opening in said layer of first dielectric, and said oversize trench opening in said layer of silicon nitride with said second dielectric;

removing that part of said layer of second dielectric above the top surface of said layer of silicon nitride thereby forming a second dielectric plug, wherein said second dielectric plug fills said trench in said substrate, said trench opening in said layer of first dielectric, and said oversize trench opening in said layer of silicon nitride and extends beyond said edges of said trench opening in said layer of first dielectric and said edges of said trench in said substrate;

etching away said layer of silicon nitride using an etching method which preferentially etches said silicon nitride relative to said first dielectric and said second dielectric; and etching away that part of said layer of first dielectric not covered by said second dielectric plug.

14. The method of claim 13 wherein said layer of first dielectric is a layer of silicon dioxide having a thickness of between about 50 and 500 Angstroms.

15. The method of claim 13 wherein said layer of silicon nitride has a thickness of between about 300 and 2000 Angstroms.

16. The method of claim 13 wherein said layer of second dielectric is a layer of silicon dioxide having a thickness of between about 500 and 6000 Angstroms.

17. The method of claim 13 wherein said substrate is a silicon substrate having devices formed therein.

18. The method of claim 13 wherein said isotropic lateral etch is a plasma isotropic lateral etch using an etchant of oxygen.

19. The method of claim 13 wherein said isotropic lateral etch is a chemical wet etch.

20. The method of claim 13 wherein said etching away said layer of silicon nitride uses a phosphoric acid etch.

21. The method of claim 13 wherein said etching away that part of said layer of first dielectric not covered by said second dielectric plug uses a hydrofluoric acid, HF, etch.

22. The method of claim 13 wherein said removing that part of said second dielectric above the top surface of said layer of silicon nitride uses chemical mechanical polishing.

23. The method of claim 13 further comprising:

forming a layer of gate oxide on said substrate and said second dielectric plug; and forming gate electrodes on said layer of gate oxide.

* * * * *